(12) United States Patent
Cruz-Albrecht et al.

(10) Patent No.: US 8,595,157 B2
(45) Date of Patent: Nov. 26, 2013

(54) HIGH-ORDER TIME ENCODER BASED NEURON CIRCUIT USING A HYSTERESIS QUANTIZER, A ONE BIT DAC, AND A SECOND ORDER FILTER

(75) Inventors: Jose Cruz-Albrecht, Oak Park, CA (US); Peter Petre, Oak Park, CA (US); Narayan Srinivasa, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 350 days.

(21) Appl. No.: 13/151,763

(22) Filed: Jun. 2, 2011

(65) Prior Publication Data

US 2012/0310871 A1 Dec. 6, 2012

(51) Int. Cl.
*G06F 15/00* (2006.01)
(52) U.S. Cl.
USPC .......................................................... 706/12
(58) Field of Classification Search
USPC ..................................... 706/12, 15, 20, 45, 62
See application file for complete search history.

(56) References Cited

U.S. PATENT DOCUMENTS

| | | | |
|---|---|---|---|
| 5,345,398 A | 9/1994 | Lippmann et al. | 702/53 |
| 5,396,244 A | 3/1995 | Engel | 341/143 |
| 5,479,170 A | 12/1995 | Cauwenbergh et al. | 341/200 |
| 5,490,062 A * | 2/1996 | Leach et al. | 702/15 |
| 5,815,102 A | 9/1998 | Melanson | 341/143 |
| 5,894,280 A | 4/1999 | Ginetti et al. | 341/118 |
| 5,910,763 A * | 6/1999 | Flanagan | 340/286.02 |
| 6,087,968 A | 7/2000 | Roza | 341/143 |
| 6,111,531 A | 8/2000 | Farag | 341/143 |
| 6,452,524 B1 | 9/2002 | Fraleigh et al. | 341/143 |
| 6,473,019 B1 | 10/2002 | Ruha et al. | 341/143 |
| 6,940,438 B2 | 9/2005 | Koe | 341/143 |
| 6,975,682 B2 | 12/2005 | Cosand | 375/247 |
| 7,038,608 B1 | 5/2006 | Gilbert | 341/144 |
| 7,180,432 B2 | 2/2007 | Oliaei | 341/143 |
| 7,277,797 B1 * | 10/2007 | Kunitsyn et al. | 702/15 |
| 7,403,144 B1 | 7/2008 | Cruz-Albrecht | 341/143 |
| 7,405,686 B2 | 7/2008 | Laroia et al. | 341/143 |
| 7,515,084 B1 * | 4/2009 | Cruz-Albrecht et al. | 341/157 |
| 7,592,939 B1 * | 9/2009 | Cruz-Albrecht et al. | 341/144 |

(Continued)

OTHER PUBLICATIONS

U.S. Appl. No. 12/262,782, filed Nov. 6, 2008, Jose Cruz-Albrecht.

(Continued)

*Primary Examiner* — David Vincent
(74) *Attorney, Agent, or Firm* — Ladas & Parry (57) ABSTRACT

A spike domain circuit responsive to analog and/or spike domain input signals. The spike domain circuit has a hysteresis quantizer for generating a spike domain output signal z(t); a one bit DAC having an input which is coupled to receive the spike domain output signal z(t) output by the hysteresis quantizer and having an output which is coupled to a current summing node; and a second order filter stage having two inputs, one of said two inputs being coupled to receive the spike domain output signal z(t) output by the hysteresis quantizer and the other of the two inputs being coupled to receive current summed at said current summing node. The second order filter stage has an output coupled to an input of the hysteresis quantizer. The current summing node also receives signals related to the analog and/or spike domain input signals to which the circuit is responsive. The circuit may serve as a neural node and many such circuits may be utilized together to model neurons with complex biological dynamics.

16 Claims, 9 Drawing Sheets

(56) References Cited

U.S. PATENT DOCUMENTS

| | | | |
|---|---|---|---|
| 7,724,168 B1* | 5/2010 | Cruz-Albrecht et al. | 341/138 |
| 7,750,835 B1* | 7/2010 | Cruz-Albrecht et al. | 341/166 |
| 7,822,698 B1 | 10/2010 | Cruz-Albrecht | 706/34 |
| 7,996,452 B1* | 8/2011 | Cruz-Albrecht et al. | 708/400 |
| 2005/0190865 A1 | 9/2005 | Lazar et al. | 375/340 |
| 2009/0303070 A1* | 12/2009 | Zhang et al. | 340/690 |
| 2010/0225824 A1 | 9/2010 | Lazar et al. | |

OTHER PUBLICATIONS

U.S. Appl. No. 60/984,354, filed Oct. 31, 2007, Jose Cruz-Albrecht.

U.S. Appl. No. 60/984,357, filed Oct. 31, 2007, Peter Petre.

U.S. Appl. No. 12/266,299, filed Nov. 6, 2008, Jose Cruz-Albrecht.

A. Lazar and L Toth, "Perfect Recovery and Sensitivity Analysis of Time Encoded Bandlimited Signals," IEEE Trans. on Circuits and Systems-I, vol. 51, No. 10, pp. 2060-2073, Oct. 2004.

J. Cruz et al., "A 16×16 Cellular Neural Network Universal Chip," in Cellular Neural Networks and Analog VLSI, edited by L. Chua et al., Kluwer Academic Publishers, 1998.

Dighe, A.M., et al., "An Asynchronous Serial Flash Converter", $9^{th}$ Int. Conf on Electronics, Circuits and Systems, IEEE, pp. 13-15, 2002.

D.Donoho, "Compressed Sensing", IEEE Transactions on Information Theory, vol. 42, No. 4, pp. 1289-1306, Apr. 2006.

Iwamoto, M. et al., "Bandpass Delta-Sigma Class-S Amplifier", Electronic Letters, vol. 36, No. 12, pp. 1010-1012, Jun. 2000.

J. Keane and L. Atlas, "Impulses and Stochastic Artihmetic for Signal Processing" Proc. 2001 IEEE International Conference on Acoustics, Speech, and Signal Processing, pp. 1257-1260.

Roza, E., Analog to Digital Conversion via Duty Cycle Modulation, IEEE Trans. on Circuits and Systems-II, vol. 44, No. 11, pp. 907-914, Nov. 1997.

Walden, R., "Analog to Digital Converter Survey and Analysis", IEEE Journal on Selected Areas in Communication, vol. 17, No. 4, pp. 539-550, Apr. 1999.

Y. Xia and J. Wang, "A Recurrent Neural Network for Solving Nonlinear Convex Programs Subject to Linear Constraints", IEEE Trans. on Neural Networks, vol. 16, No. 2, Mar. 2005.

S. Ouzounov, et al. "Design of High-Performance Asynchronous Sigma Delta Modulators with a Binary Quantizer with Hysteresis", IEEE 2004 Custom Integrated Circuits Conference, 2004, pp. 181-184.

Hasler et al,"VLSI Neural Systems and Circuits" 1990 IEEE.* Wang et al "Review of pulse-coupled neural networks" 2009.

Laurent Perrinet ,"Emergence of filters from natural scenes in a sparse spike coding scheme", 2004.

Eugene M. Izhikevich, "Which Model to Use for Cortical Spiking Neurons?", IEEE Trans. on Neural Networks, vol. 15, No. 5, Sep. 2004.

Giacomo Indiveri, "A Low-Power Adaptive Integrated-and-fire Neuron Circuit", IEEE International Symposium on Circuits and Systems, vol. IV, pp. 820-823, 2003.

ISR and WO for PCT/US2012/040043 mailed on Jan. 14, 2013.

* cited by examiner

HIGH-ORDER TIME ENCODER BASED NEURON CIRCUIT USING A HYSTERESIS QUANTIZER, A ONE BIT DAC, AND A SECOND ORDER FILTER

CROSS REFERENCE TO RELATED APPLICATIONS

This application is related to U.S. patent application Ser. No. 11/645,936 filed Dec. 26, 2006 entitled "Pulse Domain Encoder and Filter Circuits" (now U.S. Pat. No. 7,403,144); U.S. patent application Ser. No. 11/726,860 filed Mar. 23, 2007 entitled "Spike Domain and Pulse Domain Non-Linear Processor" (now U.S. Pat. No. 7,822,698); U.S. patent application Ser. No. 11/726,484 filed Mar. 22, 2007 entitled "Analog to Digital Converter Using Asynchronous Pulse Technology" (now U.S. Pat. No. 7,515,084); U.S. patent application Ser. No. 12/262,782 filed Oct. 31, 2008 entitled "Pulse Domain Linear Programming Circuit"; and U.S. patent application Ser. No. 12/266,299 filed Nov. 6, 2008 entitled "Analog to Digital Converter Using Asynchronous Pulse Technology". Each of the foregoing patent applications is hereby incorporated herein by reference.

TECHNICAL FIELD

A new circuit is disclosed which implements a neuron with complex biologically-inspired dynamics. The circuit preferably operates in the pulse domain and is preferably of high order (the second through at least fourth orders).

The disclosed circuit is a new type of time encoder circuit. It has an internal core nonlinear $2^{nd}$ order stage, that has two state variables associated with two integrators. This core nonlinear time encoded circuit coverts an input current into a voltage spike train and can emulate the dynamics of a mathematical single-input neuron circuit. For example, it can be utilized to produce the neuron dynamics of the mathematical model of Izhikevich—discussed below. An input stage and an optional auxiliary stage (of $1^{st}$ or $2^{nd}$ order) can be used in front of core stage. The input stage is used to scale multiple inputs with different gains. The optional auxiliary stage may be used to filter these inputs.

BACKGROUND

Mathematical models of neurons with complex dynamics have been derived and numerically simulated on digital computers. See E. Izhikevich, "Which Model to Use for Cortical Spiking Neurons?," IEEE Trans. on Neural Networks, vol. 15, no. 5, September 2004. However, this work of Izhikevich is limited to deriving mathematical equation models and their numerical simulation in a discrete-time digital computer.

Previously other circuits to implement neurons have been proposed. One example is the circuit of G. Indiveri, see "A low Power Adaptive Integrate-and-Fire Neuron Circuit," IEEE International Symposium on Circuits and Systems, vol. IV, pp. 820-823, 2003. However the circuit described therein cannot produce the complex biologically-inspired complex behaviors of the mathematical models of Izhikevich.

Other circuits, with similarity to neurons, are time encoder circuits and second order time encoder circuits. See A. A. Lazar and L. T. Toth, "Perfect Recovery and Sensitivity Analysis of Time Encoded Bandlimited Signals," IEEE Trans. on Circuits and Systems—I, vol. 51, no. 10, pp. 2060-2073, October 2004 which describes a first order neuron circuit and J. Cruz-Albrecht and P. Petre, "Pulse Domain Encoders and Filter Circuits," U.S. Pat. No. 7,403,144, Jul. 22, 2008 which describes a second order neuron circuit. However the basic time encoder circuits described in these documents also cannot produce complex biologically-inspired neural behaviors, such as those of the mathematical models of Izhikevich.

Figure 1:
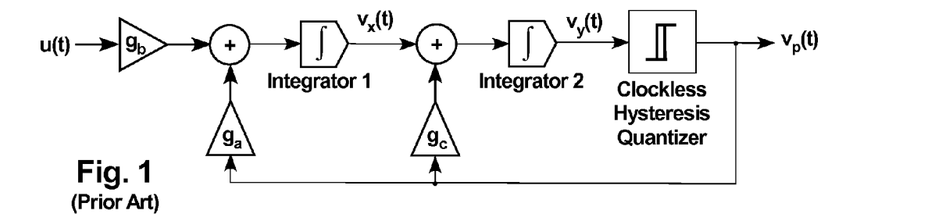
FIG. 1 depicts a prior art pulse encoder.

FIG. 1 shows prior a prior art pulse encoder (see U.S. Pat. No. 7,403,144). This circuit can convert an analog signal into pulses. However this prior art pulse encoder circuit cannot be used to emulate complex neuron behaviors modeled by Izhikevich, for example.

There is a need for circuits that allow the implementation of complex neuron dynamics, such as those modeled by Izhikevich, and preferably with simple analog components. The disclosed circuit can handle the mathematical model of Izhikevich, which can reproduce a large number of biologically inspired neuron behaviors. This mathematical model requires at least two state variables and also a nonlinear element.

BRIEF DESCRIPTION OF THE INVENTION

In one aspect the present invention provides a spike domain circuit responsive to analog and/or spike domain input signals. The spike domain circuit comprises a hysteresis quantizer for generating a spike domain output signal z(t); a one bit DAC having an input which is coupled to receive the spike domain output signal z(t) output by the hysteresis quantizer and having an output which is coupled to a current summing node; and a second order filter stage having two inputs, one of the two inputs being coupled to receive the spike domain output signal z(t) output by the hysteresis quantizer and another of the two inputs being coupled to receive current summed at the current summing node, the second order filter stage having an output coupled to an input of the hysteresis quantizer, the current summing node also receiving signals related to the analog and/or spike domain input signals.

In another aspect the present invention provides a method of modeling, in the spike domain, complex neuron dynamics, such as those modeled by Izhikevich, and responsive to analog and/or spike domain input signals, the method comprising: providing a hysteresis quantizer for generating a spike domain output signal z(t); providing a one bit DAC having an input which is coupled to receive the spike domain output signal z(t) output by the hysteresis quantizer and having an output which is coupled to a current summing node; and providing a second order filter stage having two inputs, one of the two inputs being coupled to receive the spike domain output signal z(t) output by the hysteresis quantizer and another of the two inputs being coupled to receive current summed at the current summing node, the second order filter stage having an output coupled to an input of the hysteresis quantizer, the current summing node also receiving signals related to said analog and/or spike domain input signals, the second order filter stage having a plurality of transconductance 1-bit DACs, each of said transconductance 1-bit DACs having a gain which is set to control the complex neuron dynamics to be modeled.

BRIEF DESCRIPTION OF THE DRAWINGS

FIG. 3 shows the input-output characteristic of the hysteresis quantizer used in the core circuit 300 of FIG. 2a.

FIG. 4a shows a schematic diagram of the second-order filter 310 used in the circuit of FIG. 2a.

FIG. 4d depicts a preferred hardware implementation of the hysteresis quantizer element of FIG. 2a.

FIGS. 5a-5c show a simulation setup and model of the circuit of the invention using the tool Simulink®

FIG. 6a-6d depict simulation of pulse-domain neuron circuit operating in a tonic spiking mode, where

FIG. 7a-7d depict another simulation of pulse-domain neuron circuit—in this case it is operating in a tonic bursting mode, where

FIG. 8b depicts a second order auxiliary stage which may be used in place of the first order auxiliary stage utilized in the embodiment of FIG. 8a.

DETAILED DESCRIPTION

Figure 2A:
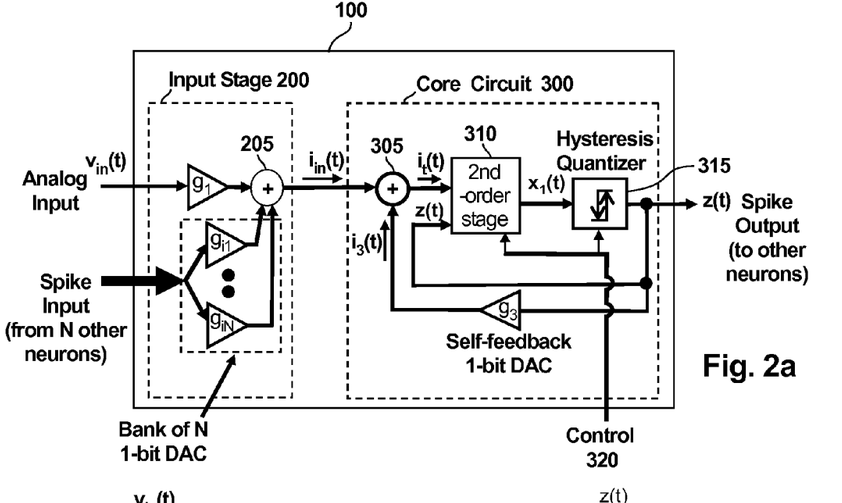
FIG. 2a shows the basic components of the pulse-domain neuron circuit in accordance with the present invention.

FIG. 2a shows the basic components of the pulse-domain neuron circuit 100 in accordance with the present invention. Circuit 100 includes an input stage 200 and a core circuit 300. The neuron circuit 100 of FIG. 2a can receive as input any of two types of signals: analog type or spike domain type. The output of the neuron circuit 100 is a spike domain type output signal z(t).

The input stage 200 receives an analog voltage input and multiple spike domain voltage inputs and produces a single current output, $i_{in}(t)$, that is fed to the core circuit 300. In the preferred embodiment the input stage 200 has: an analog transconductance amplifier, $g_1$, and an array of N transconductance-type 1-bit DACs (Digital-to-Analog Converters), $g_{i1} \ldots g_{iN}$ coupled to a summing node 205. An external analog input signal can be applied at the input of the transconductance amplifier $g_1$. Up to N external spike domain input spike signals can be applied to each of the inputs of the N 1-bit DACs, $g_{i1} \ldots g_{iN}$. The output currents of the transconductance amplifier $g_1$ and 1-bit DACs $g_{i1} \ldots g_{iN}$ are summed at the summing node 205. In the preferred embodiment the summing node 205 is simply implemented by merging wires or connections from the transconductance amplifier $g_1$ and 1-bit DACs $g_{i1} \ldots g_{iN}$. The gains of elements $g_1, g_{i1} \ldots g_{iN}$ are used to determine the weight of signals coming from an external input and from other neurons. When there is only one analog external input, but no spike domain inputs, the gain of element $g_1$ can be set to 1 and the gains of each of 1-bit DACs $g_{i1} \ldots g_{iN}$ can be set to zero (or they can be omitted). When the circuit receives an external analog input and also spike domain signal inputs from other neurons, the gains of element $g_1$ and gains of 1-bit DACs $g_{i1} \ldots g_{iN}$ are set according to the neural processing function being implemented. See U.S. patent application Ser. No. 11/726,860 filed Mar. 23, 2007 entitled "Spike Domain and Pulse Domain Non-Linear Processor" (now U.S. Pat. No. 7,822,698).

Figure 2B:
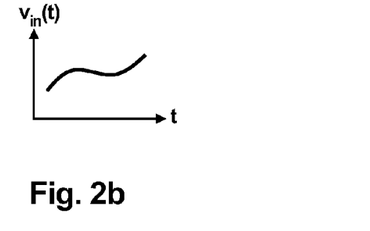
FIG. 2b shows an example an analog type signal, which signal can change continuously in amplitude.
Figure 2C:
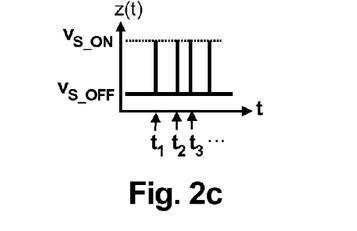
FIG. 2c shows an example of a spike domain type signal, which consists of a train of spikes (each individual spike is a short-duration pulse and the timings of the individual pulses conveys information).

The core circuit 300 receives single current output, $i_{in}(t)$, from the input stage 200 and produces the spike domain output voltage z(t). The input current can be either: (1) an analog signal, (2) a spike signal, or (3) a combination of analog and spike domain signals. The output voltage is a spike domain type signal. FIG. 2(b) shows an example an analog type signal. This signal can change continuously in amplitude. FIG. 2c shows an example of spike domain type signal. The spike waveform consists of a train of spikes (each individual spike is a short-duration pulse). The amplitude can have only two values ($V_{S\_ON}$ and $V_{S\_OFF}$). Information is encoded into the timing of the start of each of the spikes ($t_1, t_2, t_3, \ldots$).

The core circuit 300 preferably includes: (i) a programmable hysteresis quantizer 315, (ii) a self-feedback 1-bit Digital-to-Analog Converter (DAC), $g_3$, (iii) a summing node 305, and (iv) a programmable $2^{nd}$ order filter stage 310. In the preferred embodiment the summing node 302 is simply implemented by merging wires or connections from the output of the input stage 200 and the output of the self-feedback 1-bit Digital-to-Analog Converter (DAC), $g_3$. A preferred embodiment of the $2^{nd}$ order filter stage 310 is shown by and described with reference to FIG. 4a. The gain of element $g_3$ is nominally set to 1. A larger value increases the spike rate at the output of the neuron.

The timing of the output spikes z(t) are a function of the input $i_{in}(t)$, the internal circuit components and control bias signals 320 that are used to program the hysteresis quantizer 315 and the $2^{nd}$ order filter stage 310. The pulse-domain neuron circuit 100 can be programmed to produce (in response to a given input $v_{in}(t)$) the same spike waveforms that are generated by solving the equations of the mathematical model of Izhikevich.

Figure 3:
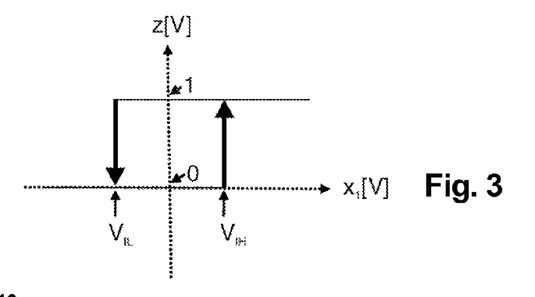

FIG. 3 shows the input-output characteristic of the hysteresis quantizer 315 used in the core circuit 300. The output, z(t), of the hysteresis quantizer 315 can have one of two values. In the preferred embodiment they are +1V and 0V. They depend on $x_1(t)$ as follows:

$z(t)=+1$ if $x_1(t) \geq V_{IH}$;

$z(t)=0$ if $x_1(t) \leq V_{IL}$; and $z(t)$ remains constant (at +1 or at 0) if $V_{IL} < x_1(t) < V_{IH}$.

The parameters $V_{IL}$ and $V_{IH}$ are preferably programmable and are preferably set via two external control lines in control bus 320. A preferred hardware implementation of the hysteresis quantizer 315 is depicted by FIG. 4d and includes a regular comparator 441, a fixed resistor 442 and a variable resistor 444 (or variable gain amplifier). In the preferred embodiment of the hysteresis quantizer 315 shown in FIG. 4d one control line provides a voltage $V_R$ and another control line is used to set the resistance of element 444. The values of parameters $V_{IH}$ and $V_{IL}$ are changed by adjusting the $V_R$ value and the resistance value of element 444. The embodiment of FIG. 4d also preferably has an inverter 446 at its output which preferably changes a logical −1 at it input to a logical zero at its output and preferably changes a logical +1 at it input to a logical −1 at its output. The front end of the circuit of FIG. 4b (discussed below) produces an inverting-type input-output transfer characteristic (very high inputs force the output to a low value and very low inputs force the output to a high value). The entire circuit of FIG. 4b, with an inverter, produces the desired non-inverting input output transfer characteristic (very high inputs force the output to a high value and very low inputs force the output to a low value).

Figure 4A:
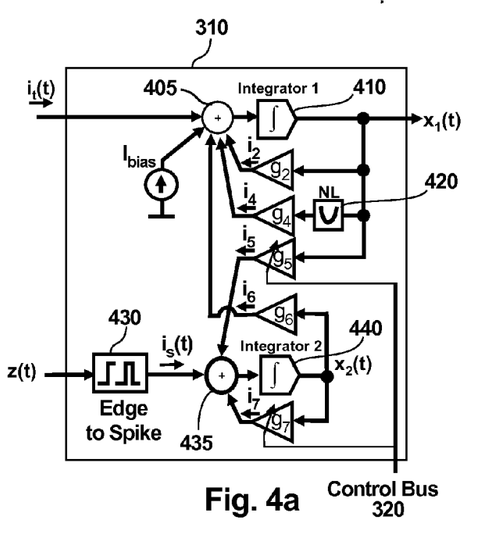

FIG. 4a shows a schematic diagram of the $2^{nd}$ order filter 310 used in the circuit of FIG. 2a. The filter 310 preferably includes:

(i) two integrators 410 and 440. The voltages at the output each integrator 410 and 440 are the state variables denoted as $x_1(t)$ and $x_2(t)$.

(ii) five gain stages denoted as $g_2$, $g_4$, $g_5$, $g_6$ and $g_7$ each provided by a transconductance amplifier. Three of the gain stages, $g_2$, $g_4$ and $g_6$ can have fixed transconductance values and they can be implemented by fixed-gain transconductance amplifiers. In one embodiment these values are as listed in Table I. In other embodiments other scaled values can be used. Two of the gain stages, $g_5$ and $g_7$, have their transconductance gain values externally controlled, preferably according to voltages on wires in the control bus 320. In one embodiment the gain of gain stage $g_5$=ab and the gain of gain stage $g_7$=−a, where a and b are parameters of the mathematical models of Izhikevich. Gain stages $g_2$, $g_4$, and $g_6$ are connected at their outputs to a summing node 405 along with the input $i_t(t)$ to the second order stage 310. The input of gain stage $g_2$ is taken from the output $x_1(t)$ of integrator 410. The input of integrator 410 is coupled to summing node 405. The input of gain stage $g_4$ is taken from the output of nonlinear element 420 mentioned below.

(iii) a bias current source 415 which produces the bias term I of the mathematical model of Izhikevich. The output of the bias current source 415 is coupled to summing node 405.

Figure 4B:
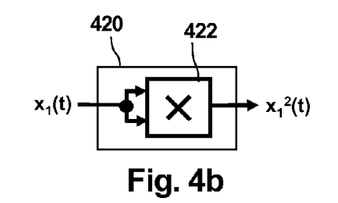
FIG. 4b shows the nonlinear element of FIG. 4a in greater detail.
Figure 4C:
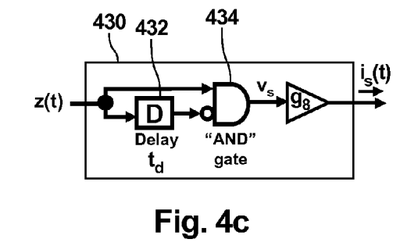
FIG. 4c depicts the edge-to-spike element of FIG. 4a in greater detail.
Figure 4D:
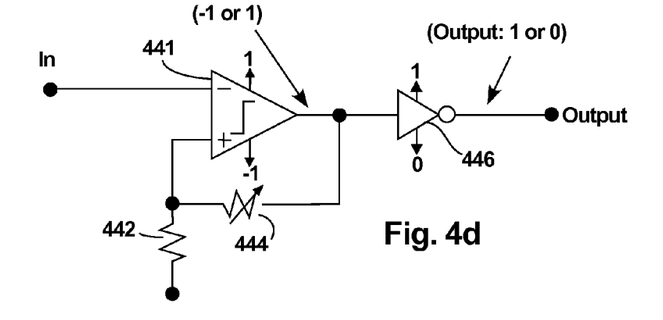

(iv) the nonlinear (NL) element 420, which is shown in greater detail by FIG. 4b, whose input is coupled to the output $x_1(t)$ of integrator 410 and whose output is coupled to an input of gain stage $g_4$; and (v) an edge-to-spike domain block 430, which is shown in greater detail by FIG. 4c. The second order filter 310 has two inputs: the analog current $i_t(t)$ from summing node 305, which is applied to summing node 405 (so nodes 305 and 405 can in fact be a common node) and the voltage z(t) produced at the output of the hysteresis quantizer 315 of FIG. 2a, which voltage is applied to the edge-to-spike domain block 430. The second order filter 310 has a single analog voltage output $x_1(t)$ which is coupled to the hysteresis quantizer 315. Block 430 has an output $i_s(t)$ which is applied to a summing node 435 along with the outputs of gain stages $g_5$ and $g_7$. Gain stage $g_5$ has an input coupled to the output $x_1(t)$ of integrator 410 while gain stages $g_6$ and $g_7$ have their inputs coupled to the output $x_2(t)$ of integrator 440. The output of gain stage $g_7$ is coupled to summing node 435, which provides an input to integrator 440.

The edge spike domain block 430 serves two purposes. First, it converts a spike domain voltage input z(t) to a spike domain current output $i_s(t)$ and it also transforms the duration of spikes in the input z(t) to a shorter, well-defined duration $t_d$. The duration $t_d$ is set by the delay value of delay element 432. As a result, the duration of the output current spikes in $i_s(t)$ are insensitive to small variations in the duration of the voltage input spikes in z(t). The edge spike domain block 430 is used to produce the well-defined spike of current that is fed into integrator 2 (element 440) every time that there is a voltage spike at the output of the neuron. This current spike has to have a well defined charge (=amplitude of the current times the duration of the short spike). A typical value in a preferred embodiment is $2\times10^{-6}$ C. This is achieved by the circuit of FIG. 4c. This circuit controls the both the amplitude of the short spike (for example 0.2 A) and its duration (for example $10^{-5}$ sec) even in the presence of variations in the duration and amplitude of the neuron voltage spikes at z(t). Other values of current amplitude and duration other than those discussed above can be used as long as both produce the same desired charge.

FIG. 4b shows a possible embodiment of the nonlinear (NL) element 420 of FIG. 4a in greater detail. It preferably comprises merely a squaring circuit 422 that can be implemented, for example, by an analog multiplier.

FIG. 4c depicts the circuit of the edge-to-spike domain block 430 in greater detail. This circuit takes a voltage pulse input and produces a current spike output of time duration $t_d$. It preferably comprises delay stage 432 having a delay $t_d$, a logical AND gate 434 with a sign inversion at one of its inputs, and a transconductance amplifier $g_8$. In one embodiment the gain of transconductance amplifier $g_8$ equals $d/(t_d \cdot 1000)$, where d is a parameter of the mathematical model of Izhikevich. These values assume that each of the two integrators have a gain of $1000 \cdot (1/s)$ (each of these integrators can be implemented simply using a capacitor of 1 mF). Table I shows values of $t_d$ and $g_8$ in one embodiment.

Figure 5A:
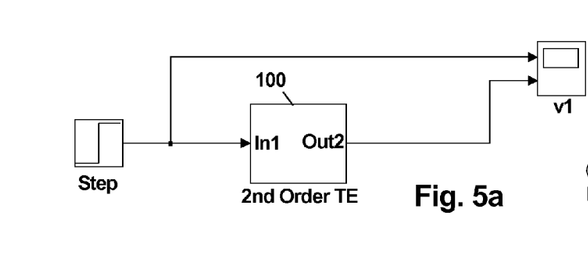
FIG. 5a shows a top-level simulation setup composed of one input source, a symbol box representing a Simulink® model of the circuit of the invention, and a scope to monitor key signals during simulation.
Figure 5B:
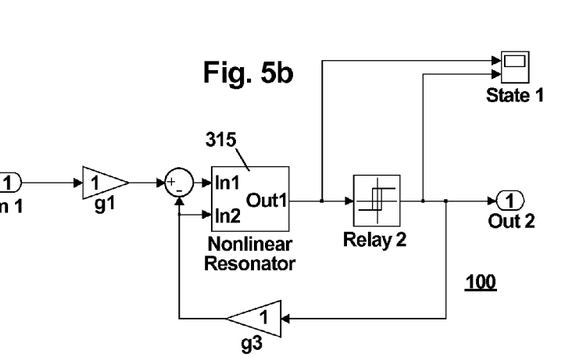
FIG. 5b shows a detail of the Simulink® model of the circuit of the invention.
Figure 5C:
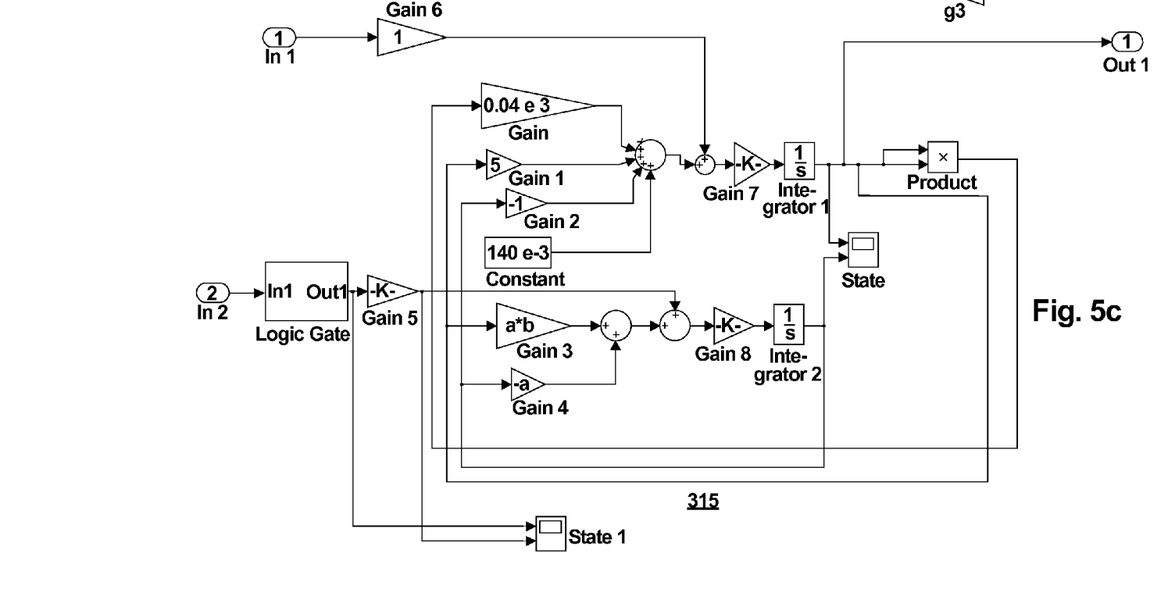
FIG. 5c shows a further detail of the Simulink® model used for block 310 of FIG. 5b.

FIGS. 5a-5c show a model of the circuit 100 using Simulink® software sold by The MathWorks, Inc. of Natick, Mass. This software has been utilized to simulate and verify the operation of the circuit 100 for the case of receiving one analog input. FIG. 5a shows the second order neuron circuit 100 connected to an analog input source and to an output. In this example the analog input consist of a step function. FIG. 5b shows a top level diagram of the neuron circuit 100. This corresponds to the same circuit of FIG. 2a, but without the bank of 1-bit DACs (that have value or 0, and are not required when the neuron only receives an analog input). FIG. 5c shows a detail of the internal second-order filter 310. This corresponds to the circuit of FIG. 4a. The values of the components, in one embodiment, may be as shown in Table I.

Figure 6A:
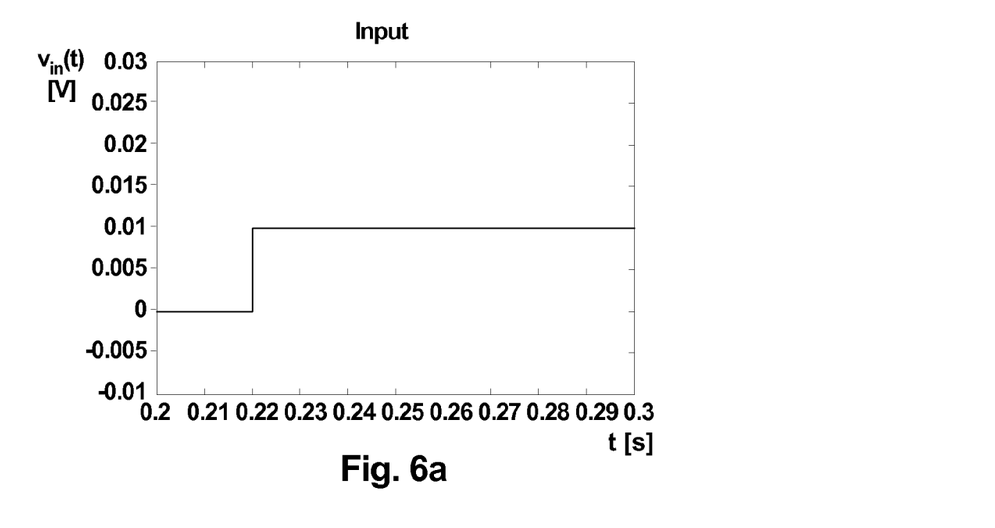
FIG. 6a depicts the Input signal.
Figure 6B:
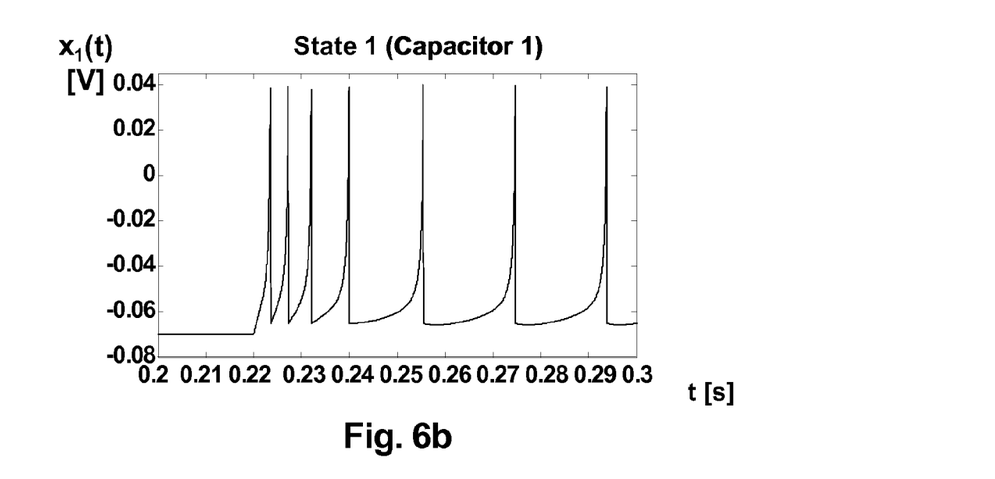
FIG. 6b depicts the internal signal $x_1(t)$.
Figure 6C:
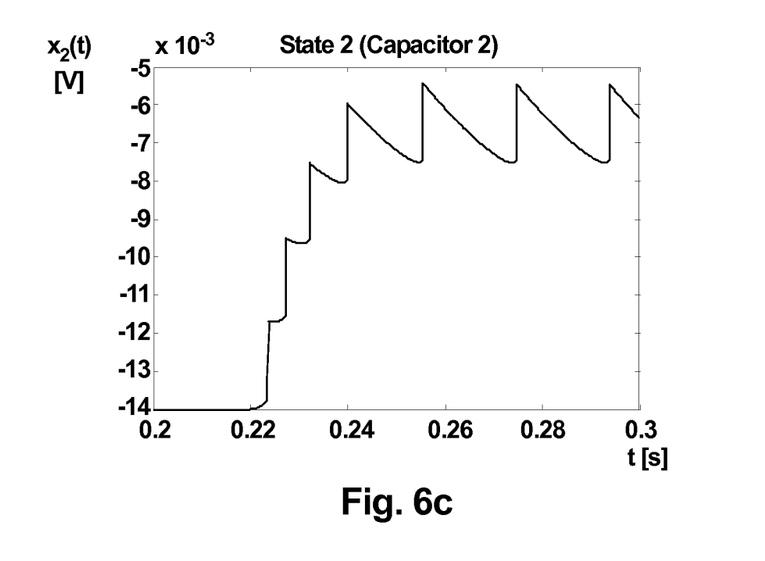
FIG. 6c depicts the internal signal $x_2(t)$.
Figure 6D:
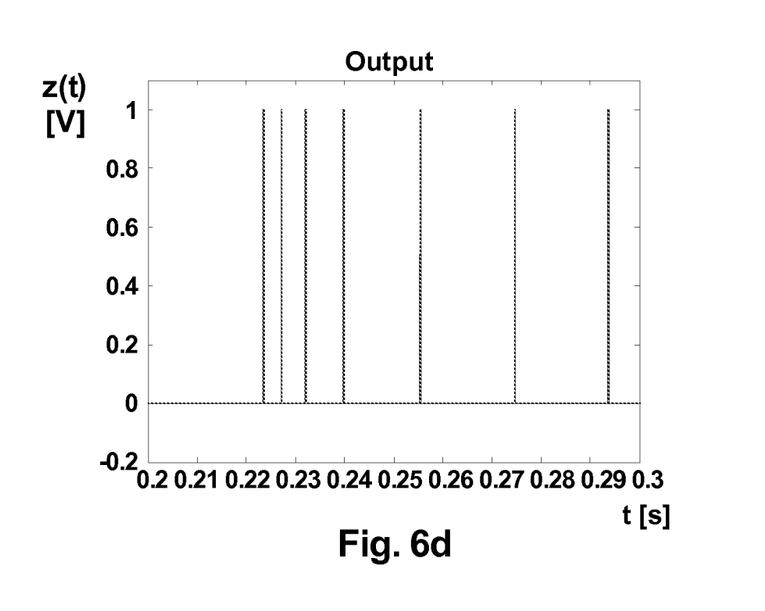
FIG. 6d depicts the Output signal.

FIGS. 6a-6d show one embodiment of an exemplary simulation of the circuit 100. In this exemplary simulation the circuit is operating in tonic-spiking mode (spiking at the output in response to an steady input). The parameters of the hysteresis quantizer in this exemplary simulation are set to $V_{IH}$=0.040 and $V_{IL}$=−0.065. The analog input is a step waveform of 10 mV amplitude. FIG. 6a depicts the Input signal, FIG. 6b depicts the internal signal $x_1(t)$, FIG. 6c depicts the internal signal $x_2(t)$, and FIG. 6d depicts the Output signal. The values used for the other parameters are set forth in Table I for this exemplary simulation.

Figure 7A:
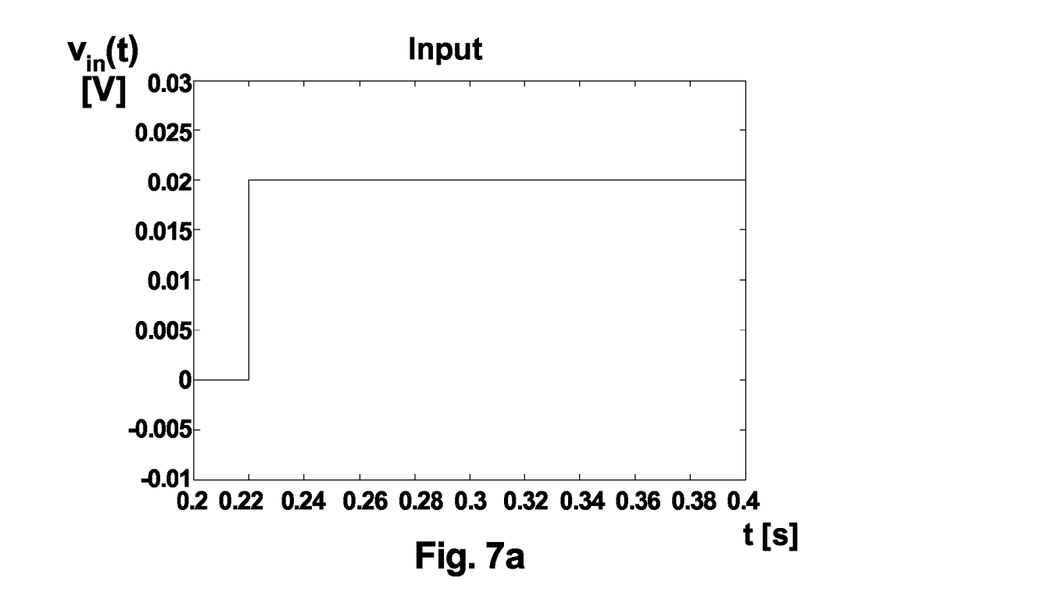
FIG. 7a depicts the Input signal.
Figure 7B:
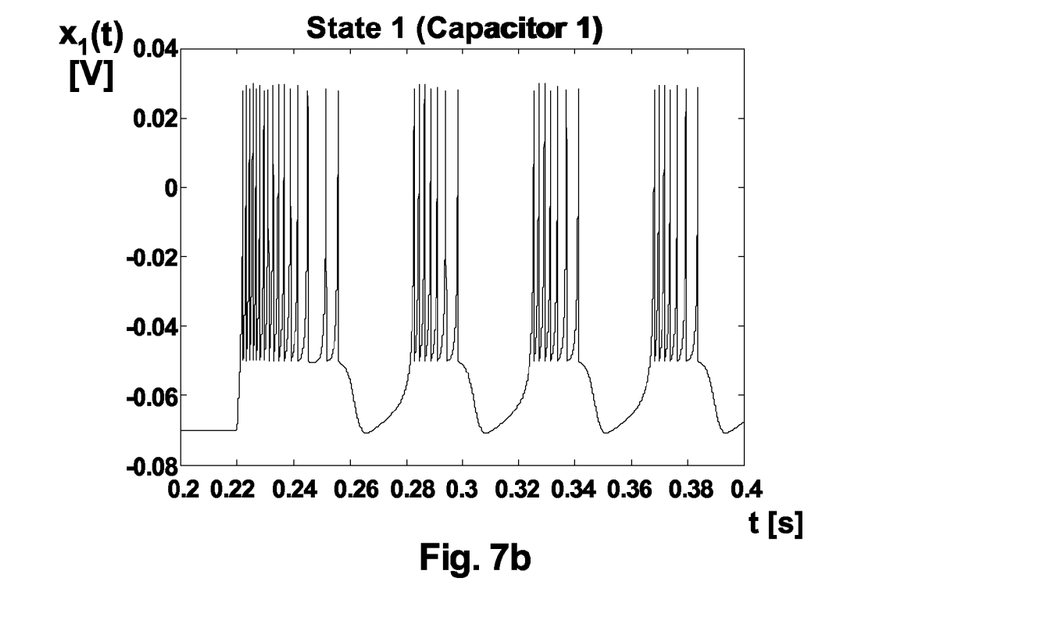
FIG. 7b depicts the internal signal $x_1(t)$.
Figure 7C:
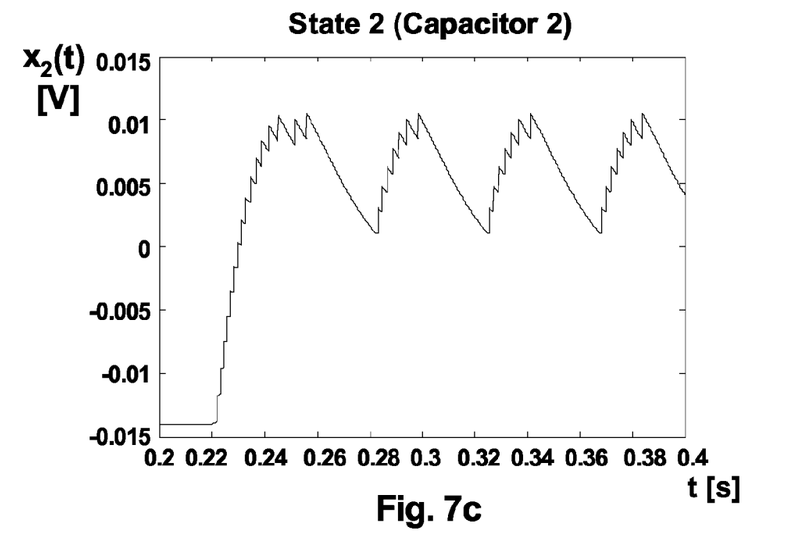
FIG. 7c depicts the internal signal $x_2(t)$.
Figure 7D:
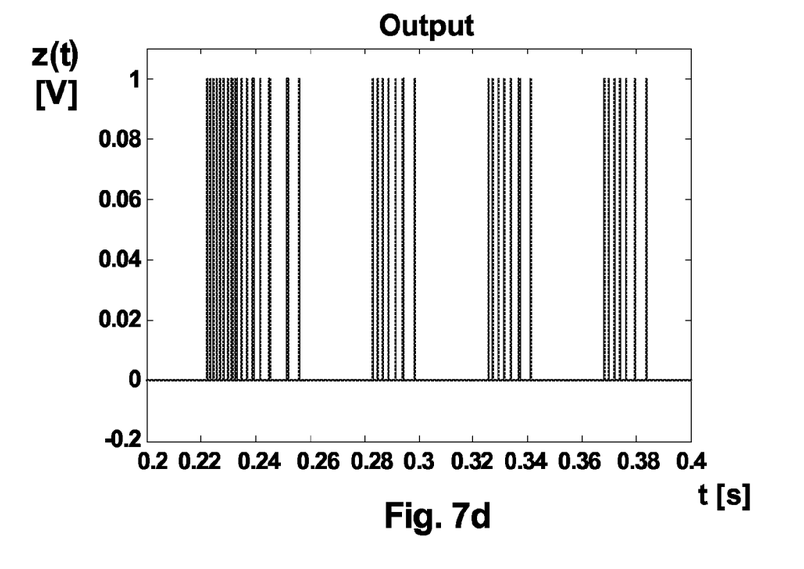
FIG. 7d depicts the Output signal.

FIGS. 7a-7d shows another example of a simulation of the circuit 100. In this example the circuit 199 is operating in tonic bursting mode (spiking at the output in response to an steady input). The parameters of the hysteresis quantizer are set to $V_{IH}$=0.030 and $V_{IL}$=−0.050. The analog input is a step waveform of 20 mV amplitude. FIG. 7a depicts the Input signal $V_{in}(t)$ 201, FIG. 7b depicts the internal signal $x_1(t)$, FIG. 7c depicts the internal signal $x_2(t)$, and FIG. 7d depicts the output signal. The Input signal $V_{in}(t)$ is the input to block 100. The internal signal $x_1(t)$ is at the output of block 310 (see FIG. 1). The internal signal $x_2(t)$ is at the output of block 440 (see FIG. 4a). The output signal is produced at the output of block 100 (see FIG. 1). The values preferably used for the other parameters in one embodiment are set forth in Table I.

See the table below for the various parameters preferably used in the one embodiment of embodiments of FIGS. 6a-6d and FIGS. 7a-7d.

TABLE I

| Parameter | Value |
| --- | --- |
| g1 | 1 [A/V] |
| g2 | 5 [A/V] |
| g3 | 1 [A/V] |
| g4 | 40 [A/V] |
| g5 | 0.004 [A/V] |
| g6 | −1 [A/V] |
| g7 | 0.02 [A/V] |
| g8 | 0.2 [A/V] |
| IBIAS | 0.14 [A] |
| td | $1 \times 10^{-5}$ [s] |

The values set forth in the preceding paragraphs and table may be varied as needed according to the problem being solved. The td is a fixed delay in the circuit of the invention. The I of the Izkikevich model can set by IBIAS. The circuit described herein has the dynamics of the Izkikevich model if VIL=c, g7=−a, g5=a*b, and the maximum value of current produced at the output of block 430 is set to d*100. Of course, other values may be used if desired.

Figure 8A:
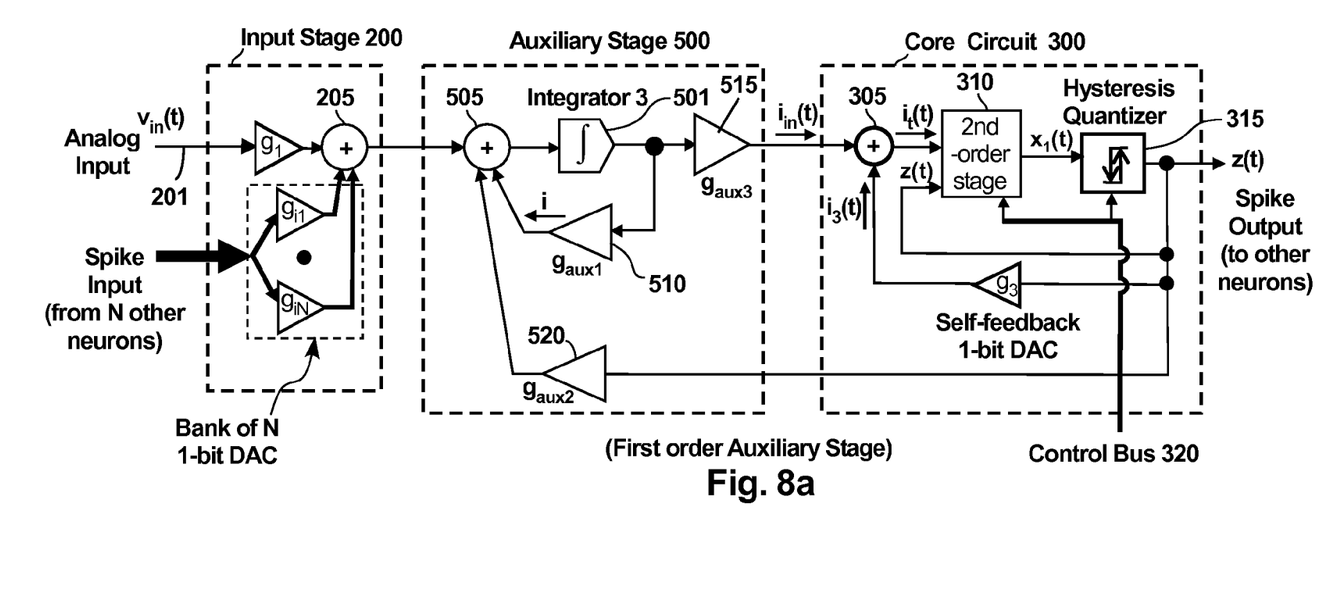
FIG. 8a depicts an embodiment similar to the embodiment of FIG. 2a, but with a first order auxiliary stage added between the core circuit and the input stage.
Figure 8B:
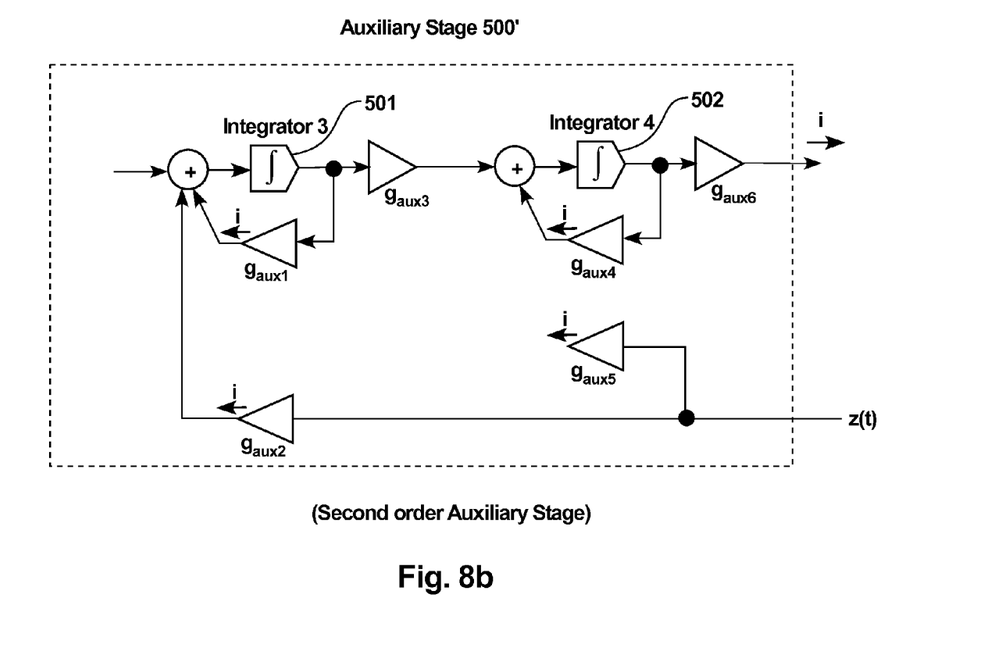

FIG. 8a depicts an embodiment of the pulse-domain neuron circuit of FIG. 2a with an added auxiliary stage 500. An optional auxiliary stage 500 can be used in front of core circuit 300 and after the input stage 200. The input stage 200 is used to scale multiple inputs with different gains. The optional auxiliary stage 500 is used to filter these inputs. The auxiliary stage 500 of FIG. 8a is a first order stage (it has a single integrator 501). A second order stage 500' is depicted in FIG. 8b and it may be substituted for the first order auxiliary stage 500. It has two integrators 501 and 502.

The optional auxiliary stage or circuit 500 may be used to filter the signal provided into the core circuit. The integrator 3 and the analog feedback gain element 510 implements a first-order low pass filter. The value of $g_{aux1}$ is used to set the cut-off frequency of the filter. In one embodiment, $g_{aux1}$=100. The element 515 is used for buffering, and in one embodiment has gain value of $g_{aux3}$=1. The optional element 520 is a 1-bit DAC that can be used for spike-type filtering.

The auxiliary stage 500' may alternatively be used to filter the signal provided to the core circuit 300. The integrators 3 and 4 and the analog feedback gain elements $g_{aux1}$ and $g_{aux4}$ implement a second-order low pass filter. In one embodiment, $g_{aux1}$=$g_{aux4}$=100. The elements $g_{aux3}$ and $g_{aux6}$ are used for buffering. In one embodiment have gain value of $g_{aux3}$=1. The optional elements $g_{aux2}$ and $g_{aux5}$ are 1-bit DACs that can be used for spike-type filtering.

The order of disclosed core circuit 300 is two (corresponding to the two internal integrators 410 and 440). The order of the auxiliary circuit is one (see auxiliary stage 500 which has one integrator 501) or two (see auxiliary stage 500' which has two integrators 501 and 502). Thus, the order of the complete circuit is two, three or four. The order of the complete circuit is two if the optional auxiliary circuits (auxiliary stages 500 and 500') are omitted. The order of the complete circuit is three if optional auxiliary circuit 500 is utilized, while the order of the complete circuit is four if optional auxiliary circuit 500' is utilized.

It should be understood that the above-described embodiments are merely some possible examples of implementations of the presently disclosed technology, set forth for a clearer understanding of the principles of this disclosure. Many variations and modifications may be made to the above-described embodiments of the invention without departing substantially from the principles of the invention. All such modifications and variations are intended to be included herein within the scope of this disclosure and the present invention and protected by the following claims:

What is claimed is:

1. A spike domain circuit responsive to analog and/or spike domain input signals, said spike domain circuit comprising:
    a. a hysteresis quantizer for generating a spike domain output signal z(t);
    b. a one bit DAC having an input which is coupled to receive the spike domain output signal z(t) output by the hysteresis quantizer and having an output which is coupled to a current summing node;
    c. a second order filter stage having two inputs, one of said two inputs being coupled to receive the spike domain output signal z(t) output by the hysteresis quantizer and another of the two inputs being coupled to receive current summed at said current summing node, the second order filter stage having an output coupled to an input of the hysteresis quantizer, the current summing node also receiving signals related to said analog and/or spike domain input signals.

2. The spike domain circuit of claim 1 wherein the signals related to said analog and/or spike domain input signals applied to said summing node correspond to (i) a gain-adjusted version of the analog input signal and (ii) to gain-adjusted version of a plurality of spike inputs after having been applied to a corresponding plurality of one bit DACs.

3. The spike domain circuit of claim 1 wherein the signals related to said analog and/or spike domain input signals applied to said summing node correspond (i) to a filtered and gain-adjusted version of the analog input signal and (ii) to a filtered and gain-adjusted version of a plurality of spike inputs after having been applied to a corresponding plurality of one bit DACs.

4. The spike domain circuit of claim 3 wherein the filtered and gain-adjusted version of the plurality of spike inputs is filtered by a first order auxiliary stage having a single integrator disposed between the current summing node and the corresponding plurality of one bit DACs.

5. The spike domain circuit of claim 3 wherein the filtered and gain-adjusted version of the plurality of spike inputs is filtered by a second order auxiliary stage having two integrators disposed between the current summing node and the corresponding plurality of one bit DACs.

6. The spike domain circuit of claim 1 wherein the second order filter comprises:
    a. an edge to spike domain convertor for converting undesirably long duration spikes in the output of the hysteresis quantizer to a shorter duration;
    b. a first integrator whose output is the output of the second order filter and whose input is coupled to a first current summing node, the first current summing node also being coupled to the current summing node defined by claim 1;
    c. a second integrator whose input is coupled to a second current summing node, the second current summing node also receiving the shorter duration spikes from the edge to spike domain convertor;
    c. a first plurality of transconductance amplifiers having outputs coupled to said first current summing node and selected ones of the first plurality of transconductance amplifiers having inputs coupled to the output of the first integrator, with at least one of said first plurality of transconductance amplifiers having its input coupled to the output of the first integrator via a nonlinear element and with another selected one of the first plurality of transconductance amplifiers having an input coupled to an output of the second integrator;

d. a second plurality of transconductance amplifiers having outputs coupled to the second current summing node with a selected one of the second plurality of transconductance amplifiers having an input coupled to the output of the first integrator and with another selected one of the second plurality of transconductance amplifiers having an input coupled to the output of the second integrator.

7. The spike domain circuit of claim 1 wherein the hysteresis quantizer is programmable and responsive to control signals for programming the hysteresis quantizer.

8. The spike domain circuit of claim 1 wherein the second order filter stage is programmable and responsive to control signals for programming the second order filter stage.

9. A method of modeling, in the spike domain, complex neuron dynamics, such as those modeled by Izhikevich, and responsive to analog and/or spike domain input signals, said method comprising:
 a. providing a hysteresis quantizer for generating a spike domain output signal $z(t)$;
 b. providing a one bit DAC having an input which is coupled to receive the spike domain output signal $z(t)$ output by the hysteresis quantizer and having an output which is coupled to a current summing node;
 c. providing a second order filter stage having two inputs, one of said two inputs being coupled to receive the spike domain output signal $z(t)$ output by the hysteresis quantizer and another of the two inputs being coupled to receive current summed at said current summing node, the second order filter stage having an output coupled to an input of the hysteresis quantizer, the current summing node also receiving signals related to said analog and/or spike domain input signals, the second order filter stage having a plurality of transconductance 1-bit DACs, each of said transconductance 1-bit DACs having a gain which is set to control the complex neuron dynamics to be modeled.

10. The method claim 8 wherein the signals related to said analog and/or spike domain input signals applied to said summing node correspond to (i) a gain-adjusted version of the analog input signal and (ii) to gain-adjusted version of a plurality of spike inputs after having been applied to a corresponding plurality of one bit DACs.

11. The method of claim 9 wherein the signals related to said analog and/or spike domain input signals applied to said summing node correspond (i) to a filtered and gain-adjusted version of the analog input signal and (ii) to a filtered and gain-adjusted version of a plurality of spike inputs after having been applied to a corresponding plurality of one bit DACs.

12. The method of claim 11 wherein the filtered and gain-adjusted version of the plurality of spike inputs is filtered by a first order auxiliary stage having a single integrator disposed between the current summing node and the corresponding plurality of one bit DACs.

13. The method of claim 11 wherein the filtered and gain-adjusted version of the plurality of spike inputs is filtered by a second order auxiliary stage having two integrators disposed between the current summing node and the corresponding plurality of one bit DACs.

14. The method of claim 9 wherein the second order filter comprises:
 a. an edge to spike domain convertor for converting undesirably long duration spikes in the output of the hysteresis quantizer to a shorter duration;
 b. a first integrator whose output is the output of the second order filter and whose input is coupled to a first current summing node, the first current summing node also being coupled to the current summing node of claim 7;
 c. a second integrator whose input is coupled to a second current summing node, the second current summing node also receiving the shorter duration spikes from the edge to spike domain convertor;
 c. the plurality of transconductance 1-bit DACs including first and second pluralities of transconductance 1-bit DACs, the first plurality of transconductance 1-bit DACs having outputs coupled to said first current summing node and selected ones of the first plurality of transconductance 1-bit DACs having inputs coupled to the output of the first integrator, with at least one of said first plurality of transconductance 1-bit DACs having its input coupled to the output of the first integrator via a nonlinear element and with another selected one of the first plurality of transconductance 1-bit DACs having an input coupled to an output of the second integrator;
 d. a second plurality of transconductance 1-bit DACs having outputs coupled to the second current summing node with a selected one of the second plurality of transconductance 1-bit DACs having an input coupled to the output of the first integrator and with another selected one of the second plurality of transconductance 1-bit DACs having an input coupled to the output of the second integrator.

15. The method of claim 9 wherein the hysteresis quantizer is programmable and responsive to control signals for programming the hysteresis quantizer.

16. The method of claim 9 wherein the second order filter stage is programmable and responsive to control signals for programming the second order filter stage.

* * * * *

UNITED STATES PATENT AND TRADEMARK OFFICE
CERTIFICATE OF CORRECTION

PATENT NO.         : 8,595,157 B2                         Page 1 of 1
APPLICATION NO.    : 13/151763
DATED              : November 26, 2013
INVENTOR(S)        : Jose Cruz-Albrecht et al.

It is certified that error appears in the above-identified patent and that said Letters Patent is hereby corrected as shown below:

In the Specification, in the section directly after Cross Reference to Related Applications and before the section Technical Field, please insert the following paragraph:

--STATEMENT REGARDING FEDERALLY SPONSORED RESEARCH OR DEVELOPMENT

The present invention was made with support from the United States Government under contract no. HRL0011-09-C-0001 awarded by SyNAPSE. The U.S. Government has certain rights in the invention.--

Signed and Sealed this
Twenty-ninth Day of March, 2016

Michelle K. Lee
*Director of the United States Patent and Trademark Office*